US010393813B2

(12) United States Patent
Sun et al.

(10) Patent No.: US 10,393,813 B2
(45) Date of Patent: Aug. 27, 2019

(54) ON-BOARD STATE OF HEALTH MONITORING OF BATTERIES USING INCREMENTAL CAPACITY ANALYSIS

(71) Applicant: The Regents of The University of Michigan, Ann Arbor, MI (US)

(72) Inventors: Jing Sun, Superior Township, MI (US); Huei Peng, Ann Arbor, MI (US); Caihao Weng, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 1033 days.

(21) Appl. No.: 14/469,117

(22) Filed: Aug. 26, 2014

(65) Prior Publication Data

US 2015/0066406 A1    Mar. 5, 2015

Related U.S. Application Data

(60) Provisional application No. 61/870,256, filed on Aug. 27, 2013.

(51) Int. Cl.
*G01R 31/367* (2019.01)
*H02J 7/00* (2006.01)
(Continued)

(52) U.S. Cl.
CPC .............. *G01R 31/367* (2019.01); *B60L 3/12* (2013.01); *B60L 58/16* (2019.02); *G01R 31/392* (2019.01); *H02J 7/0021* (2013.01); *B60L 2240/547* (2013.01); *B60L 2250/16* (2013.01); *G01R 31/3842* (2019.01); *Y02T 10/7005* (2013.01); *Y02T 10/705* (2013.01); *Y02T 10/7055* (2013.01)

(58) Field of Classification Search
CPC ............ B60L 11/1857; B60L 2240/547; B60L 2250/16; B60L 3/12; G01R 31/3624; G01R 31/3651; G01R 31/3679; H02J 7/0021
USPC ................................ 320/134; 702/63; 429/61
See application file for complete search history.

(56) References Cited

U.S. PATENT DOCUMENTS

| 7,983,862 | B2 | 7/2011 | Zhang |
| 8,159,189 | B2 | 4/2012 | Zhang |

(Continued)

OTHER PUBLICATIONS

C. Weng et al "On-Board State of Health Monitoring of Lithium-ion Batteries Using Incremental Capacity Analysis with Support Vector Regression", Journal of Power Sources (Sep. 21, 2012).

*Primary Examiner* — Nathaniel R Pelton
(74) *Attorney, Agent, or Firm* — Harness, Dickey & Pierce, P.L.C.

(57) ABSTRACT

A method is provided for determining capacity of a battery. The method includes: defining a model for a battery, where the model relates terminal voltage of the battery to charged capacity of the battery; taking a plurality of voltage measures of the battery, where the voltage measures are taken through a range of states of charge and the range excludes the battery being fully charged and fully discharged; determining the parameters of the model by fitting the plurality of voltage measures to the model; determining an incremental capacity curve for the battery by taking derivative of the model; and quantifying a peak of the incremental capacity curve to thereby determine a capacity of the battery.

19 Claims, 11 Drawing Sheets

(51) Int. Cl.
  *B60L 3/12* (2006.01)
  *G01R 31/392* (2019.01)
  *B60L 58/16* (2019.01)
  *G01R 31/3842* (2019.01)

(56) References Cited

U.S. PATENT DOCUMENTS

| | | |
|---|---|---|
| 2005/0001627 A1 | 1/2005 | Anbuky et al. |
| 2009/0146664 A1 | 6/2009 | Zhang |
| 2009/0322340 A1 | 12/2009 | Zhang et al. |
| 2009/0326841 A1 | 12/2009 | Zhang et al. |
| 2011/0148424 A1* | 6/2011 | Chiang .............. G01R 31/3624 324/427 |
| 2011/0231054 A1 | 9/2011 | Zhang |
| 2012/0310561 A1 | 12/2012 | Middleton et al. |
| 2013/0154577 A1* | 6/2013 | Iwane ................ G01R 31/3624 320/162 |
| 2014/0244191 A1* | 8/2014 | Oka .................... G01R 21/133 702/61 |
| 2014/0266060 A1* | 9/2014 | Ying .................... G01R 31/361 320/134 |

\* cited by examiner

ON-BOARD STATE OF HEALTH MONITORING OF BATTERIES USING INCREMENTAL CAPACITY ANALYSIS

CROSS-REFERENCE TO RELATED APPLICATIONS

This application claims the benefit of U.S. Provisional Application No. 61/870,256, filed on Aug. 27, 2013. The entire disclosure of the above application is incorporated herein by reference.

GOVERNMENT CLAUSE

This invention was made with government support under DE-PI0000012 awarded by the Department of Energy. The Government has certain rights in the invention.

FIELD

The present disclosure relates to monitoring battery state of health in applications such as on-board an electric vehicle.

BACKGROUND

The research and development of electric vehicles (EVs) have been accelerated at unprecedented pace in recent years, driven primarily by their energy efficiency and environmental benefits. At local level, EVs do not emit any pollutants or consume any gasoline, and in combination with electricity from renewable energy, they could achieve low emission and fuel consumption on a well-to-wheel basis. Nevertheless, despite the numerous advantages of EVs over internal combustion engine (ICE) based conventional vehicles, the performance of EVs is still limited due to the challenges in the development of reliable, low cost and long life cycle battery systems.

While scientists are continuously looking for new materials to build next-generation batteries with even higher energy and power density, there are many difficulties to be solved for the battery management and system integration. The two most important tasks are known as the state-of-charge (SOC) estimation and state-of-health (SOH) determination, and both have been studied extensively in the literature. SOC is commonly defined as "the percentage of the maximum possible charge that is present inside a rechargeable battery" and SOH is "a 'measure' that reflects the general condition of a battery and its ability to deliver the specified performance in comparison with a fresh battery". Typically the quantitative definition of SOH is based either on the battery capacity or the internal resistance depending on specific applications.

Many methods for on-line SOC estimation have been studied including coulomb counting, open circuit voltage-SOC (OCV-SOC) mapping and model based approach with extended Kalman filter (EKF). In contrast, the development of an on-line SOH monitoring technique is more challenging because of the complicated electrochemical mechanism involved in battery aging. Whereas it is possible to assess the resistance growth issue by both off-line test such as electrochemical impedance spectroscopy (EIS) and on-line identification algorithms such as the use of least squares method, the detection of capacity fading still largely relies on laboratory measurements and off-line analysis.

One conventional and most common method in determining battery capacity fading is based on the OCV-SOC curve. However, it requires fully charging or discharging the battery at low rate (e.g., $\frac{1}{25}$C) or measuring the open circuit voltage after a long relaxation period (e.g., more than 2 hours) at SOC levels that span the entire range. Both methods require time-consuming tests and thus are not applicable for on-board implementation with real-life operation data. An alternative approach of studying capacity loss is the so-called incremental capacity analysis (ICA). ICA transforms voltage plateaus, which is related to a first-order phase transformation, or inflection points, which is associated with a formation of solid solution, on charging/discharging voltage (V-Q) curve into clearly identifiable dQ/dV peaks on incremental capacity (IC) curve. The concept of ICA originally came from the intercalation process of lithium and the corresponding staging phenomenon at the graphite anode. ICA has the advantage to detect a gradual change in cell behavior during a life-cycle test, with greater sensitivity than those based on conventional charge/discharge curves and yield key information on the cell behavior associated with its electrochemical properties. Although ICA was proved to be an effective tool for analyzing battery capacity fading, most studies have focused on understanding the electrochemical aging mechanism and no study has been reported on the real-time application of ICA. Meanwhile, since all the peaks on an IC curve lie within the voltage plateau region of the V-Q curve, which is relatively flat and more sensitive to measurement noise, calculating dQ/dV directly from data set could be difficult. Hence, effective and robust algorithms of obtaining the IC curve need to be developed.

This section provides background information related to the present disclosure which is not necessarily prior art.

SUMMARY

This section provides a general summary of the disclosure, and is not a comprehensive disclosure of its full scope or all of its features.

In one embodiment, a method is provided for monitoring state of health of a battery. The method includes: defining a model for a battery, where the model relates terminal voltage of the battery to charged capacity of the battery in terms of unknown parameters; measuring voltage of the battery through a range of states of charge, where the range excludes the battery being fully charged and fully discharged; determining the parameters of the model by fitting the voltage measures to the model; determining an incremental capacity curve for the battery by taking derivative of the model; and identifying a peak of the incremental capacity curve, where the magnitude of the peak corresponds to a state of health for the battery. It is envisioned that the voltage measures may be taken during one of charging or discharging of the battery. Depending on the chemistry of the target battery, the range may vary between thirty percent and eighty percent.

In one aspect, the battery model is defined in accordance with support vector regression.

In another aspect, the parameters of the model are determined using a linear programming method or a least square method.

In another embodiment, a method is provided for determining capacity of a battery. The method includes: defining a model for a battery, where the model relates terminal voltage of the battery to charged capacity of the battery; receiving a plurality of voltage measures of the battery, where the voltage measures are taken through a range of states of charge and the range excludes the battery being fully charged and fully discharged; determining the parameters of the model by fitting the plurality of voltage measures to the model; determining an incremental capacity curve for the battery by taking derivative of the model; and quantifying a peak of the incremental capacity curve to thereby determine a capacity of the battery.

In yet another embodiment, a battery monitoring device is provided. The battery monitoring device includes: a data store for storing a model for a battery, and a battery monitor interfaced with a battery to measure voltage of the battery through a range of states of charge. The battery monitor determines the parameters of the model by fitting voltage measures from the battery to the model, determines an incremental capacity curve for the battery by taking derivative of the model, and quantifies a peak of the incremental capacity curve to thereby determine a capacity of the battery. In some instances, the battery monitor is implemented by computer executable instructions executed by a computer processor.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1A:
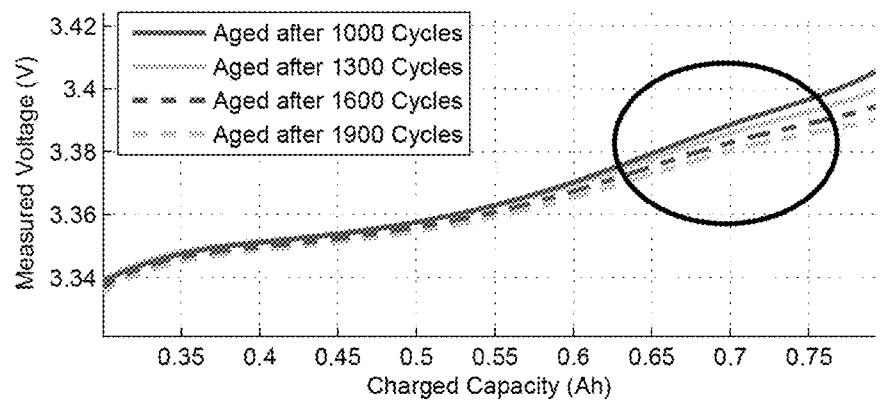
FIGS. 1A and 1B are graphs illustrating a V-Q curve and an IC curve, respectively, for a battery cell.
Figure 1B:
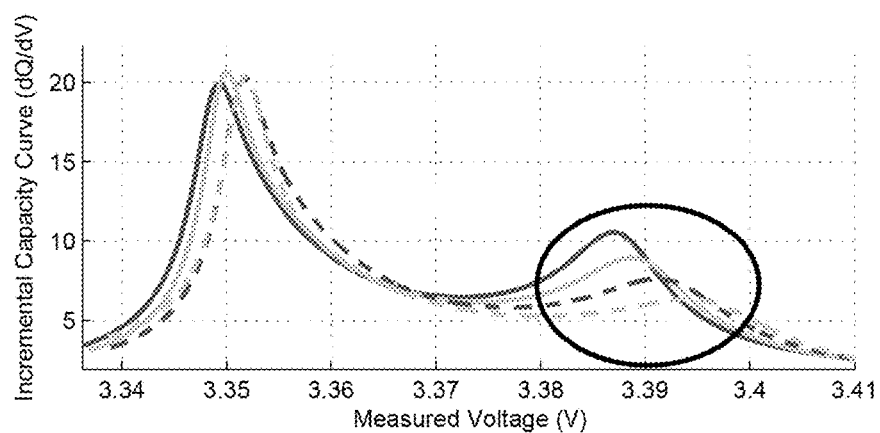

ICA has the advantage to detect a gradual change in cell behavior during a life-cycle test, with greater sensitivity than those based on conventional charge/discharge curves and yield key information on the cell behavior associated with its electrochemical properties. As illustrated by FIG. 1, which shows the test data at different aging stage for a LiFePO$_4$ battery, the IC curve (FIG. 1B) has much identifiable aging signs than the V-Q curve (FIG. 1A). It is useful particularly for battery SOH monitoring as the extracted peak values and their change pattern on the IC curves are closely related to the battery capacity fading, and can be used for characterizing the aging mechanism. While reference is made to a battery having a particular lithium ion chemistry, it is readily understood that the concepts described herein are applicable to cells having other chemistries as well.

Figure 2A:
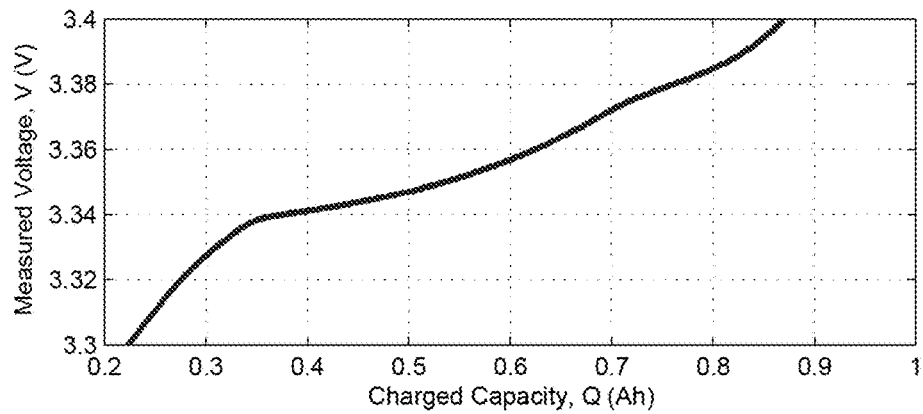
FIGS. 2A and 2B are graphs illustrating the sensitivity of numerically derived dQ/dV curves to measurement noise.
Figure 2B:
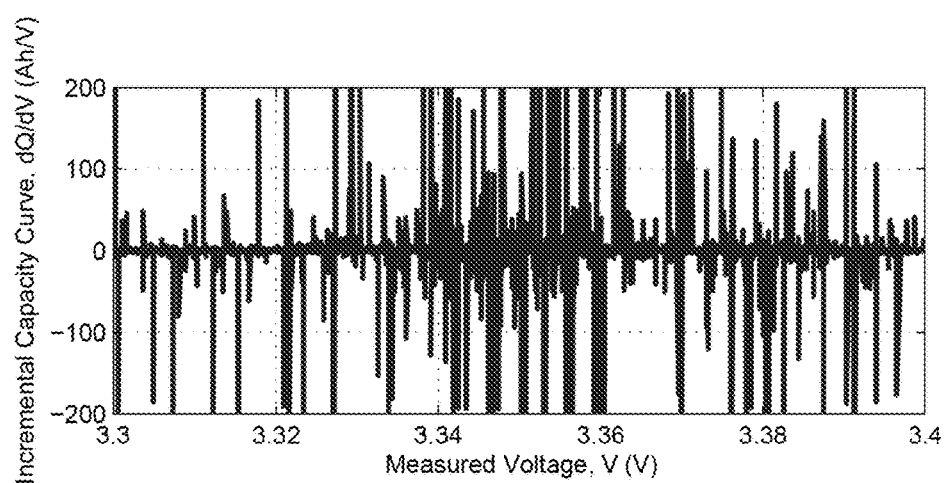

Because of measurement noise, performing the ICA directly from the measured V-Q curve has proven to be not a viable option, especially for on-board BMS, where the measurement precision is limited, it is required to develop appropriate data processing functions so that ICA can be applied. FIG. 2 shows how sensitive numerical differentiation is to the measurement noise.

Several numerical procedures have been developed and evaluated for extracting the IC curves from battery V-Q data. While the ICA results are sensitive to the selection of curve fitting method, the support vector regression (SVR) approach with the Gaussian radial basis function (rbf) kernel is shown to be the most robust and effective method. The use of support vector regression (SVR) to represent the V-Q relation and then using analytic derivative to obtain the IC curve provides the most consistent identification results with moderate computational load.

As discussed above, SVR was chosen for battery V-Q curve identification because of its demonstrated potential in the realm of nonlinear system identification. Let x=q,y=v be the input and output of the SVR model, where q represents the battery charged capacity, v is the measured voltage. The SVR model for the V-Q curve can thereby be represented as $$y = \Sigma_{i=1}^{N} \beta_i K(x_i, x) + \mu \tag{1}$$

where N is the number of data points in the data set, $\beta_i$s and $\mu$ are the model parameters, whose values are determined based on the data set, and $K(\bullet,\bullet)$ is the selected kernel. In this study, the rbf kernel is used and is expressed as $$\mathcal{K}(x, x') = \exp\left(\frac{-\|x - x'\|^2}{2\sigma^2}\right) \tag{2}$$

where $\tau$ is the adjustable parameter for the kernel function.

In one example embodiment, the parameters used in model (1) are identified by solving a convex quadratic programming (QP) problem. Through the QP-SVR and appropriate selected kernel, the flatness property is enforced in both the feature space and input space. Conventional QP-SVR has been successfully applied in identifying nonlinear dynamic systems. However, the implementation of QP-SVR may not guarantee sufficient model sparsity. LP-SVR that employs $l_1$ norm as regularizer was then proposed to improve the model sparsity and computational efficiency LP was used as the optimization engine to derive the SVR model.

The SVR using $l_1$ regularizer formulates the optimization problem as follows, $$\min_{\beta, \mu, \xi^+, \xi^-} \|\beta\|_1 + w \sum_{n=1}^{N} (\xi_n^+ + \xi_n^-), \tag{3}$$

$$\text{subject to} \begin{cases} \sum_{i=1}^{N} \beta_i \mathcal{K}(x_i, x_n) + \mu - y_n \leq \varepsilon + \xi_n^+ \\ y_n - \sum_{i=1}^{N} \beta_i \mathcal{K}(x_i, x_n) - \mu \leq \varepsilon + \xi_n^- \\ \xi^+, \xi^- \geq 0 \end{cases}$$

whereas $\xi_n^+$'s and $\xi_n^-$'s are the slack variables introduced to cope with infeasible constraints, w is the weighting factor, £ is the precision parameter, $\|\cdot\|_1$ denotes the $l_1$ norm in coefficient space and $\beta$ is defined as $\beta=(\beta_1, \ldots, \beta_N)^T$. The optimal result usually gives zero value for most of the $\beta_i$s and the $x_i$s corresponding to non-zero $\beta_i$s are called SVs.

In order to establish the problem as an LP optimization, the coefficients $\beta_i$s need to be decomposed (using the property of linear piecewise convex function minimization) as, $$\beta_i = \alpha_i^+ - \alpha_i^- \quad |\beta_i| = \alpha_i^+ + \alpha_i^- \tag{4}$$

where $\alpha_i^+$'s and $\alpha_i^-$'s are nonnegative and satisfy $\alpha_i^+ \cdot \alpha_i^- = 0$.

Following the derivation reported in "Linear programming support vector regression with wavelet kernel: A new approach to nonlinear dynamical system identification," Math. Comput. Simulat., vol 79, pp 2051-2063, (2009), the SVR problem using $l_1$ regularizer can be reformulated as a linear programming (LP) problem, $$\min c^T \begin{pmatrix} \alpha^+ \\ \alpha^- \\ \xi^+ \\ \xi^- \\ \mu \end{pmatrix}, \tag{5}$$

subject to $$\begin{cases} \begin{pmatrix} K & -K & -I & 0 & 1 \\ -K & K & 0 & -I & -1 \end{pmatrix} \begin{pmatrix} \alpha^+ \\ \alpha^- \\ \xi^+ \\ \xi^- \\ \mu \end{pmatrix} \leq \begin{pmatrix} \varepsilon + y \\ \varepsilon - y \end{pmatrix} \\ \alpha^+, \alpha^-, \xi^+, \xi^-, \mu \end{cases}$$

where $$c = \left(\underbrace{1, \ldots, 1}_{2N}, \underbrace{w, \ldots, w}_{2N}, 0\right)^T, \tag{6}$$

$$y = (y_1, \ldots, y_N)^T,$$
$$\alpha^+ = (\alpha_1^+, \ldots \alpha_N^+)^T,$$
$$\alpha^- = (\alpha_1^-, \ldots \alpha_N^-)^T,$$
$$\xi^+ = (\xi_1^+, \ldots \xi_N^+)^T,$$
$$\xi^- = (\xi_N^-, \ldots \xi_N^-)^T,$$

and I is an N×N identity matrix. K is the kernel matrix with entries defined as $K_{ij} = K(x_i, x_j)$, $$K = \begin{pmatrix} \mathcal{K}_{(x_1,x_1)} & \mathcal{K}_{(x_1,x_2)} & \cdots & \mathcal{K}_{(x_1,x_N)} \\ \mathcal{K}_{(x_2,x_1)} & \mathcal{K}_{(x_2,x_2)} & \cdots & \mathcal{K}_{(x_2,x_N)} \\ \vdots & \vdots & \ddots & \vdots \\ \mathcal{K}_{(x_N,x_1)} & \mathcal{K}_{(x_N,x_2)} & \cdots & \mathcal{K}_{(x_N,x_N)} \end{pmatrix}. \tag{7}$$

The LP problem (5) is bounded and feasible by default and can always be solved using standard algorithms, such as the simplex method or the interior method.

Figure 3A:
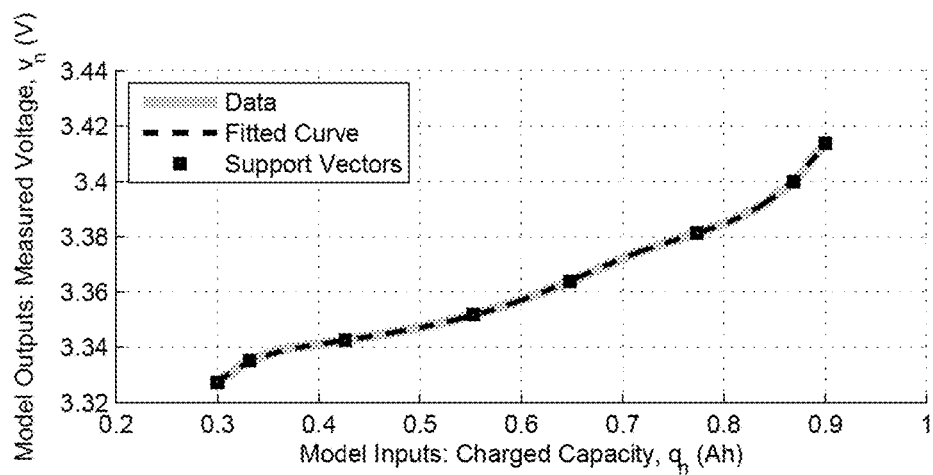
FIGS. 3A and 3B are graphs illustrating a V-Q curve and an IC curve, respectively, for a battery cell derived using an LP-SVR algorithm.
Figure 3B:
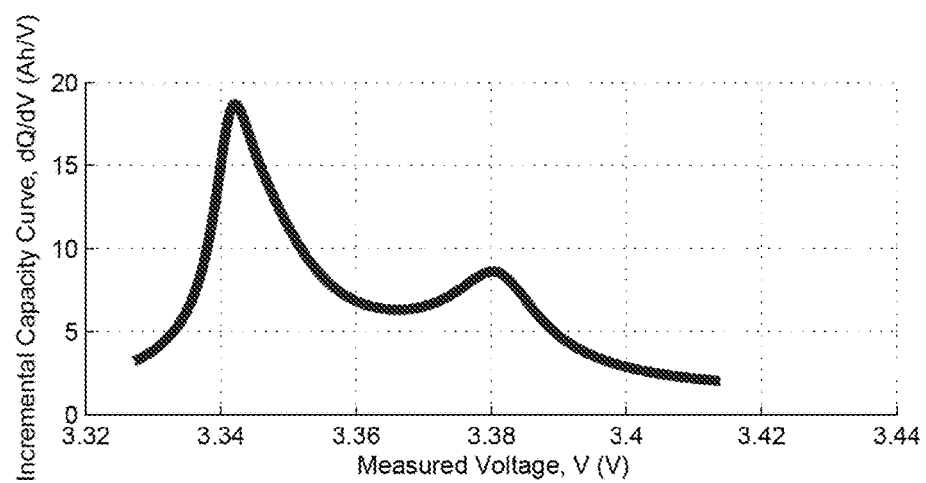

FIG. 3 shows how the LP-SVR algorithm is implemented for the identification of the battery V-Q curve. First the parameters in model (1) are determined, and the SVR model of the V-Q curve $$f(x_n) = \sum_{i=1}^{N_{sv}} \beta_i K(sv_i, x_n) + \mu \tag{8}$$

is obtained, where $sv_i$ are the SVs identified by the LP-SVR algorithm and $N_{sv}$ is the total number of SVs ($N_{sv} \ll N$).

Then the IC curve can be computed from the fitted V-Q curve as follows, Using the ICA technique, battery aging information can be extracted through the changes observed from the IC peaks. Although the state of health may refer generally to either the internal resistance or capacity of the battery cell, this disclosure is primarily concerned with a measure of battery capacity.

$$\frac{dQ}{dV} = \frac{1}{f'(x_n)} = \frac{1}{\sum_{i=1}^{N_{sv}} \beta_i \mathcal{K}'(sv_i, x_n)}$$

Figure 10:
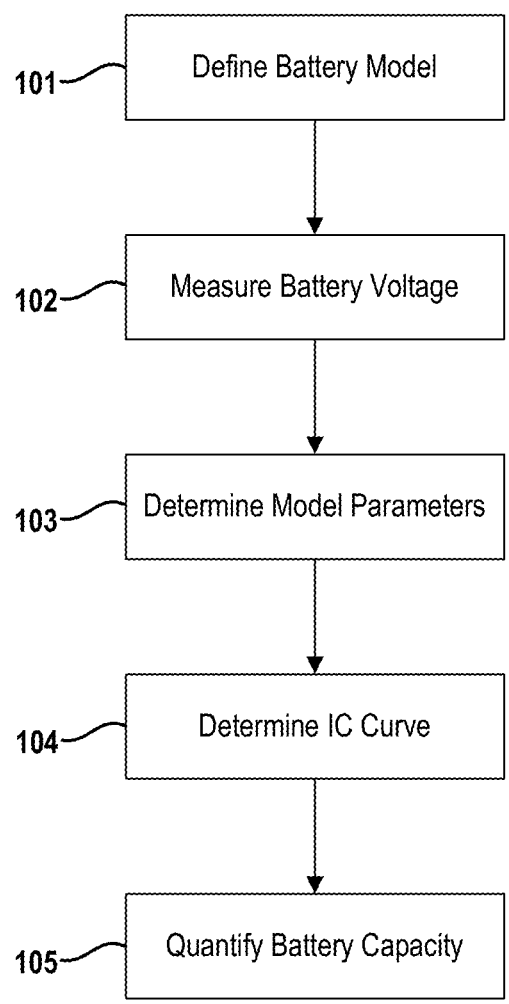
FIG. 10 is a flowchart depicting an example method for determining capacity of a battery.

FIG. 10 depicts an exemplary method for monitoring the state of health of a battery. A model for the battery is first defined at 101, where the model relates the terminal voltage of the battery to the charged capacity of the battery. In the example embodiment, the battery is defined according to support vector regression as described above, although other types of models are contemplated within the broader aspects of this disclosure. While the state of health for a battery may refer generally to either the internal resistance or capacity of the battery cell, this disclosure is primarily concerned with a measure of battery capacity.

For a battery being monitoring, the terminal voltage of the battery is measured at 102 over a range of states of charge. That is, multiple voltage measurements are taken, for example as the battery cell is being charged or discharged. In the case of a battery cell having lithium ion phosphate chemistry, the cell voltage is measured through the range of 60% to 80% state of charge; whereas, in the case of a battery cell having lithium nickel manganese cobalt chemistry, the cell voltage is measured through the range of 40% to 60% state of charge. Thus, the range may vary depending on the cell chemistry. In one embodiment, voltage measurements are taken in the range of 30% to 80% to encompass a wide variety of cell chemistries. In any case, voltage measures are not taken when the battery cell is fully charged or fully discharged and thus the range is less than the full capacity of the battery cell. Particular reference is made herein to determining capacity of a single battery cell. The method described herein has also been found to be applicable at a system level to a battery having a plurality of battery cells.

Parameters of the model are determined at 103 by fitting the voltage measures to the model. In the example embodiment, the model parameters are determined using a linear programming method as described above. It is readily understood that other optimization techniques can also be applied to determine model parameters. For example, even though LP-SVR works well for retrieving the IC curve from battery voltage measurement, it has to be applied repeatedly to different cells at different ages. For applications such as electric vehicles, which usually contain hundreds or thousands of battery cells, the extensive computational effort required for solving the LP problems could not be satisfied on-board or in real-time.

If the simple structure produced by the LP-SVR, Eqn. (8), can be generalized as a parametric model with kernel functions as the basis and the SVs invariant, for all cells under all conditions, conventional parameter estimation methods such as conditions, conventional parameter estimation methods such as a least squares method can be directly used and the computational efficiency would be greatly improved. In this case, the LP-SVR algorithm is only used for the initial model identification and parameterization, while the parameter adaptation to fit individual cell data and aging status could be achieved through linear parameter identification that does not require iterative optimization.

After solving for the model parameters, the incremental capacity curve is derived at 104 by taking the derivative of the model. The peak of the incremental capacity curve in turn correlates to the capacity of the battery. In an example embodiment, the magnitude of the peak can be used to quantify the battery capacity as indicated at 105. To do so, the magnitude of the peak of the incremental capacity curve is determined when the battery is pristine (i.e., the capacity is otherwise known to be at its maximum or at a nominal value), such that the magnitude can be determined in the same manner as described above. Subsequent determinations of the magnitude of the peak for the battery can be expressed as a ratio with a normalized value of the magnitude of the peak when the battery is pristine. This ratio or percentage represents a measure of the capacity of the battery. It is to be understood that only the relevant steps of the methodology are discussed in relation to FIG. 10, but that other steps may be needed to implement an operational system.

In order to investigate the possibility of using the SVR model as a parametric model with invariant support vectors, an LP sensitivity study, the problem (5) can be transformed into a standard LP formulation, $$\min_x c^T x,$$
$$\text{subject to} \begin{cases} A_x = b \\ x \geq 0, \end{cases}$$

where $$c = (\underbrace{1, \ldots, 1}_{2N}, \underbrace{w, \ldots, w}_{2N}, \underbrace{0, \ldots, 0}_{2N+2})^T,$$ (11)

$$x = (\alpha^+; \alpha^-; \xi^+; \xi^-; \mu^+; \mu^-; s^+ s^-),$$

$$A = \begin{pmatrix} K & -K & -I & 0 & 1 & -1 & I & 0 \\ -K & K & 0 & -I & -1 & 1 & 0 & I \end{pmatrix},$$

$$b = \begin{pmatrix} \varepsilon + y \\ \varepsilon - y \end{pmatrix}$$

$$\mu = \mu^+ + \mu^-,$$

$\mu^+$ and $\mu^-$ are added to ensure nonnegativity on the decision variable, $s^+$ and $s^-$ are added to convert the inequality constraints into equality. This new formulation is equivalent to the original problem (5).

Assume that an optimal basis matrix B for the standard LP problem, where $$B = (A_{\Omega(1)} A_{\Omega(2)} \ldots A_{\Omega(m)})$$ (12)

and $A_{\Omega(1)}, \ldots, A_{\Omega(m)}$ are linear independent columns chosen as the optimal basis from the constraint matrix A. Then B must satisfy the following conditions, $$B^{-1}b \geq 0$$

$$c - c_B B^{-1} A \geq 0$$ (13)

where $c_B$ consists of the entries in the objective vector c corresponding to the optimal basis matrix B, $$c_B = (c_{\Omega(1)} c_{\Omega(2)} \ldots c_{\Omega(m)})^T.$$ (14)

Now consider the different LP problem (10) for a different data set that is obtained either for different cell or for the same cell at a different aging stage. In this study, the battery charging data are always sampled between the same range of charged capacity with the same rate (that is, the variable x in problem (3) does not change from cell to cell and time to time). Although this might be a limitation of the technique for on-board implementation, those data samples should be available for SOH monitoring periodically during normal operations, as the range of the charged capacity data be used is within the typical operating range of electric vehicles. Because of the sampling scheme, the matrix K and the constraint matrix A do not vary as the data set changes. In addition, the objective vector c is always kept constant. The only term that is changed is b in the constraint. Therefore, the condition, $c - c_B B^{-1} A \geq 0$, is always satisfied even when data variation occurs. The optimal condition for the original optimal basis matrix B to be satisfied by the new data set can then be reduced to, $$B^{-1}b \geq 0$$ (15)

Since the optimal basis matrix B decides the values of the SVs, it can be concluded that the SVs for the battery V-Q curve model would not change if, given B, the condition (15) is satisfied for the new data set. If (15) is satisfied for all data sets collected for different cells and at different aging stages, we call the SVs invariant, and the same SVs and basis functions can be used to represent different V-Q characteristics for different cells and at different time.

Moreover, b only depends on the variable y, which is the voltage measurement from the battery charging data. Hence the sensitivity analysis only needs to be performed with respect to y in this work, and problem (10) can be rewritten as, $$\min_x c^T x,$$ (16)
$$\text{subject to} \begin{cases} A_x = b(y), \\ x \geq 0 \end{cases}.$$

The formulation shown in problem (16) is typically referred as parametric linear programming. In conventional parametric LP problems, the dependence of b on the varying parameters is usually linear. One can find the correspondence between all of the optimal basis and the varying parameters by solving systems of linear equalities. However, in the battery V-Q identification problem, the data variation is nonlinear and a proper parameterization needs to be found for characterizing the variation.

Before proceeding to more complex cases, first consider the special scenario: constant shift in the battery data. Let $y_1$ be the reference data set, and $y_2$ be the data set with a constant shift (i.e., $y_2=y_1+\rho$).

Proposition 3.1: a constant shift in the data does not change the SVs.

Proof: Assume that the optimal solution of (16) corresponding to the data $y_1$ is $\chi_*$, where $$x_* = (\alpha_*^+; \alpha_*^-; \xi_*^+; \xi_*^-; \mu_*^+; \mu_*^-; s_*^+; s_*^-;) \quad (17)$$

Please note that the column vectors in B that correspond to $\mu^+$ or $\mu^-$ are not related to the invariance of SVs, they can be treated independently from the rest of the basis vectors. For that reason, let $\hat{\chi}_*$ and $\hat{A}$ be the submatrices of $\hat{\chi}_*$ and A excluding the columns associated with $\mu^+$ or $\mu^-$, respectively. That is, $$\hat{A} = \begin{pmatrix} K & -K & -I & 0 & I & 0 \\ -K & K & 0 & -I & 0 & I \end{pmatrix}, \quad (18)$$

$$\hat{x}_* = (\alpha_*^+; \alpha_*^-; \xi_*^+; \xi_*^-; s^+s^-).$$

and $$\hat{A}_{\hat{x}_*} + \begin{pmatrix} 1 & -1 \\ -1 & 1 \end{pmatrix}\begin{pmatrix} \mu_*^+ \\ \mu_*^- \end{pmatrix} = A_{x_*} = b(y_1) = \begin{pmatrix} \varepsilon + y_1 \\ \varepsilon - y_1 \end{pmatrix} \quad (19)$$

On the other hand, let $$\begin{pmatrix} 1 & -1 \\ -1 & 1 \end{pmatrix}\begin{pmatrix} \mu^+ \\ \mu^- \end{pmatrix} = \begin{pmatrix} 1 & -1 \\ -1 & 1 \end{pmatrix}\begin{pmatrix} \mu_*^+ \\ \mu_*^- \end{pmatrix} + \begin{pmatrix} 1 \\ -1 \end{pmatrix}\rho \quad (20)$$

By substituting (20) and (19), the following equation is obtained, $$\hat{A}_{\hat{x}_*} + \begin{pmatrix} 1 & -1 \\ -1 & 1 \end{pmatrix}\begin{pmatrix} \mu^+ \\ \mu^- \end{pmatrix} = \hat{A}_{\hat{x}_*} + \begin{pmatrix} 1 & -1 \\ -1 & 1 \end{pmatrix}\begin{pmatrix} \mu_*^+ \\ \mu_*^- \end{pmatrix} + \begin{pmatrix} 1 \\ -1 \end{pmatrix}\rho \quad (21)$$

$$= \begin{pmatrix} \varepsilon + y_1 \\ \varepsilon + y_1 \end{pmatrix} + \begin{pmatrix} 1 \\ -1 \end{pmatrix}\rho$$

$$= \begin{pmatrix} \varepsilon + y_1 + \rho \\ \varepsilon - y_{1-\rho} \end{pmatrix}$$

$$= \begin{pmatrix} \varepsilon + y_2 \\ \varepsilon - y_2 \end{pmatrix}$$

$$= b(y_2)$$

where one should see that the change in $\rho$ would be compensated by adjusting either $\mu^+$ or $\mu^-$ without affecting the value of $\hat{\chi}_*$. The LP problems with $y_1$ and that with $y_2$ share the same as part of their optimal solutions. Therefore the variation in the constant term $\rho$ does not change the SVs.

Figure 4A:
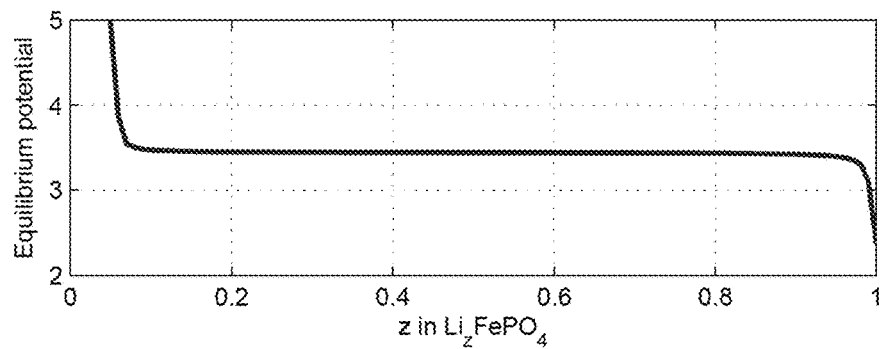
FIGS. 4A and 4B are graphs depicting equilibrium potentials for two example batteries.
Figure 4B:
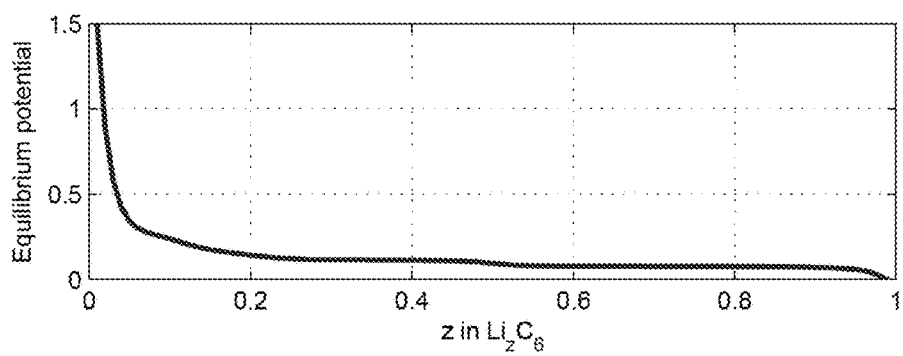

The variation in battery voltage measurement during aging could be simulated using the mechanistic battery aging model developed in Dubarry, et al's "Synthesize battery degradation modes via a diagnostic and prognostic model", J. Power Sources, vol. 219, pp 204-216 (2012). The battery model considers the aging mechanism of both the positive and negative electrodes, and could reflect the qualitative relationship between the equilibrium potentials and battery aging status. FIG. 4 shows the equilibrium potentials of $LiFePO_4$ batteries. The overall equilibrium potential of the battery cell is the difference between the positive electrode and the negative electrode, $V_{total}=V_{PE}-V_{NE}$ (see FIG. 5).

Figure 6:
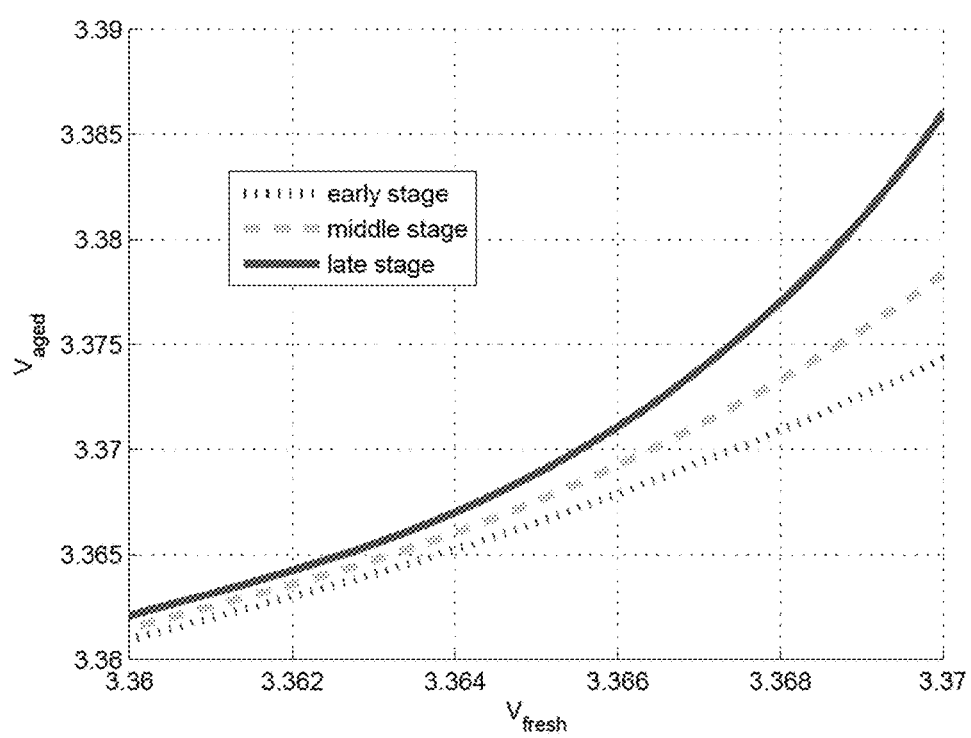
FIG. 6 is a graph depicting simulated voltage variations of batteries at different aging stages.

The capacity fading in $LiFePO_4$ cells is mainly caused by the loss of cycable lithium at the early stages of aging. The loss of cycable lithium could be simulated by shifting the relative location of the two potential curves. The simulation results are shown in FIG. 6, where the voltage output of the model of the aged cells, $V_{aged}$, is plotted versus the output of the reference cell, $V_{ref}$, which represents a new battery.

It is observed that the relation between $V_{aged}$ and $V_{ref}$ could be approximated by a quadratic function, $$y = p_2 y_*^2 + p_1 y_* + p_0 \quad (22)$$

where $p_0$, $p_1$ and $p_2$ are the parameters of the quadratic function.

Figure 7:
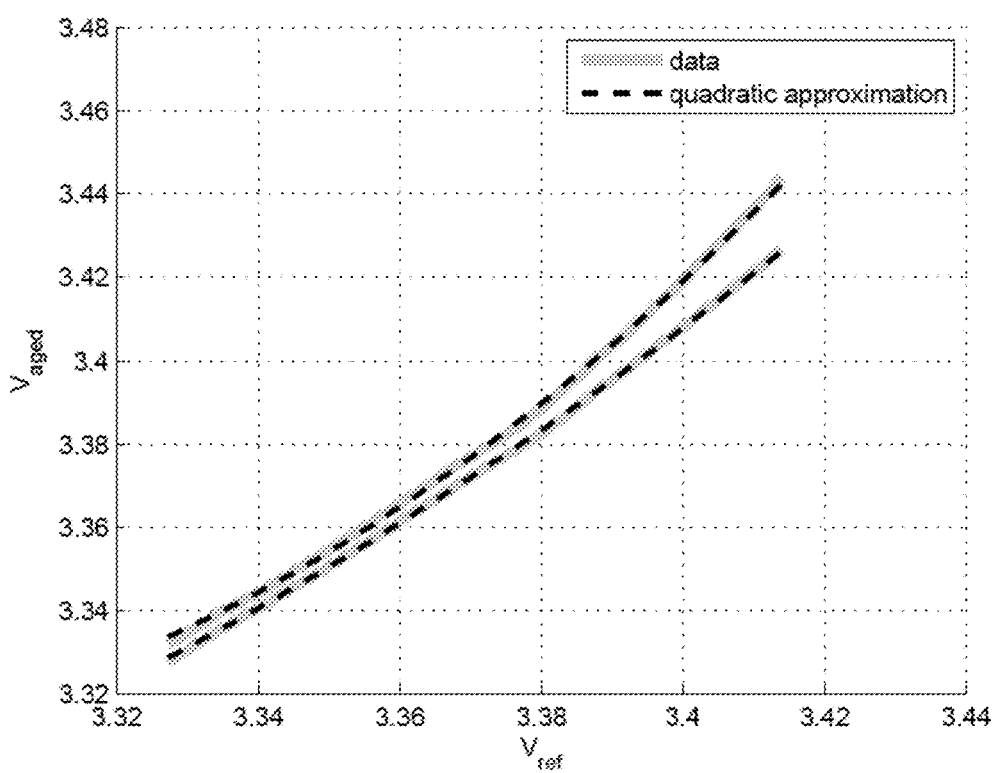
FIG. 7 is a graph depicting voltage variation of a battery at different aging stages.

The quadratic approximation (Eqn. (22)) found using the mechanistic battery aging model that relates the voltage response of the aged cell to that of a fresh new cell can be verified with the actual test data. As mentioned above, the data used in this study are collected from eight A123 APR18650 cells over a period of 18 months. FIG. 7 shows two sets of data variation at different aging stages. The curves can be fitted with quadratic functions with good accuracy. Hence, the quadratic function is indeed a good approximation and can be used for characterizing the voltage variation.

Since the characteristics of voltage variation are identified, it can then be investigated under what conditions the optimal basis computed from the reference data stays invariant when the parameters of the quadratic function vary as the cell ages. In particular, we are interested in finding the following feasible region for SV invariance. Assuming that the following problem, $$\min c^T x, \quad (23)$$

$$\text{subject to } \begin{cases} A_x = b(y_*) \\ x \geq 0 \end{cases}.$$

has the optimal basis B, then for any pair of $p_1$ and $p_2$, if the corresponding b (y) satisfies $B^{-1}b(y) \geq 0$, the pair $(p_1, p_2)$ is considered feasible. Otherwise the pair is infeasible.

As discussed above (see Prop. 3.1), the variation in the constant term $p_0$ does not affect the invariance of the SVs, and it can be ignored in solving the parametric LP problems.

Figure 8:
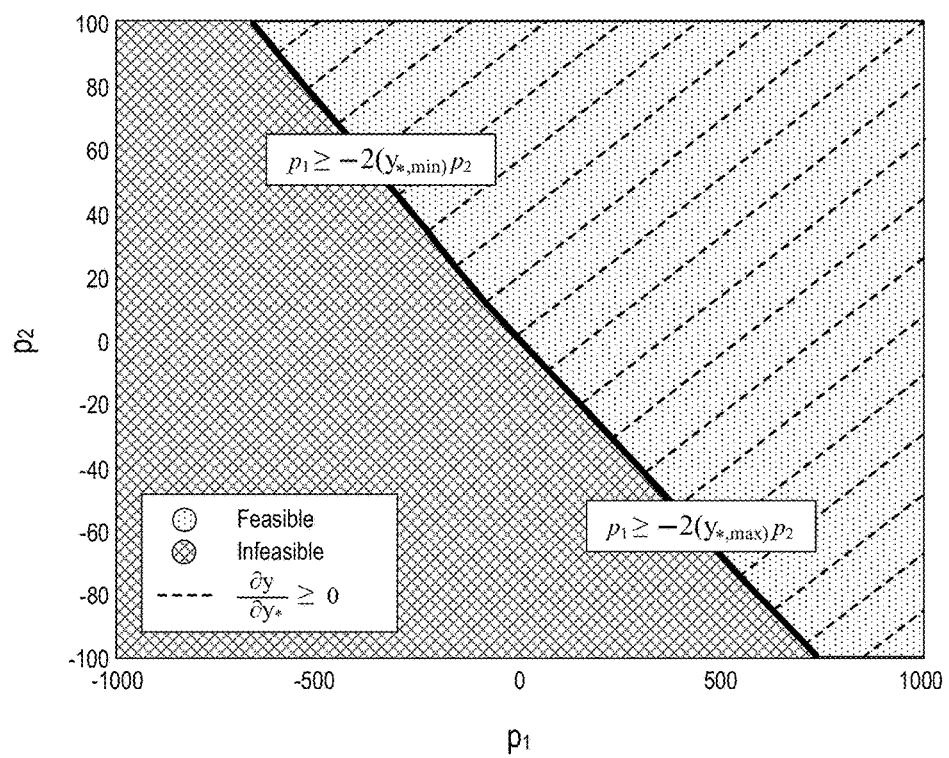
FIG. 8 is a graph depicting Monte Carlo simulation results.

Different from the general approaches for solving the conventional parametric LP problems, the dependence of b on the varying parameters $p_1$ and $p_2$, is nonlinear. Instead of solving systems of linear equalities, the determination of feasibility for each parameter pair $(p_1, p_2)$ is done through Monte Carlo simulations. The results are shown in FIG. 8, where the dotted region highlights the feasible region.

On the other hand, we can find the region, where y and $y_*$ have a monotonic increasing relation, by computing $$\frac{\partial y}{\partial y_*} = 2p_2 y_* + p_1 \geq 0 \quad (24)$$

and therefore the region (marker by dashed lines in FIG. 8) is defined by the following two boundary functions, $$p_i \geq -(2_{y_*,\min})p_2,$$

$$p_i \geq -(2_{y_*,\max})p_2. \quad (25)$$

Figure 5:
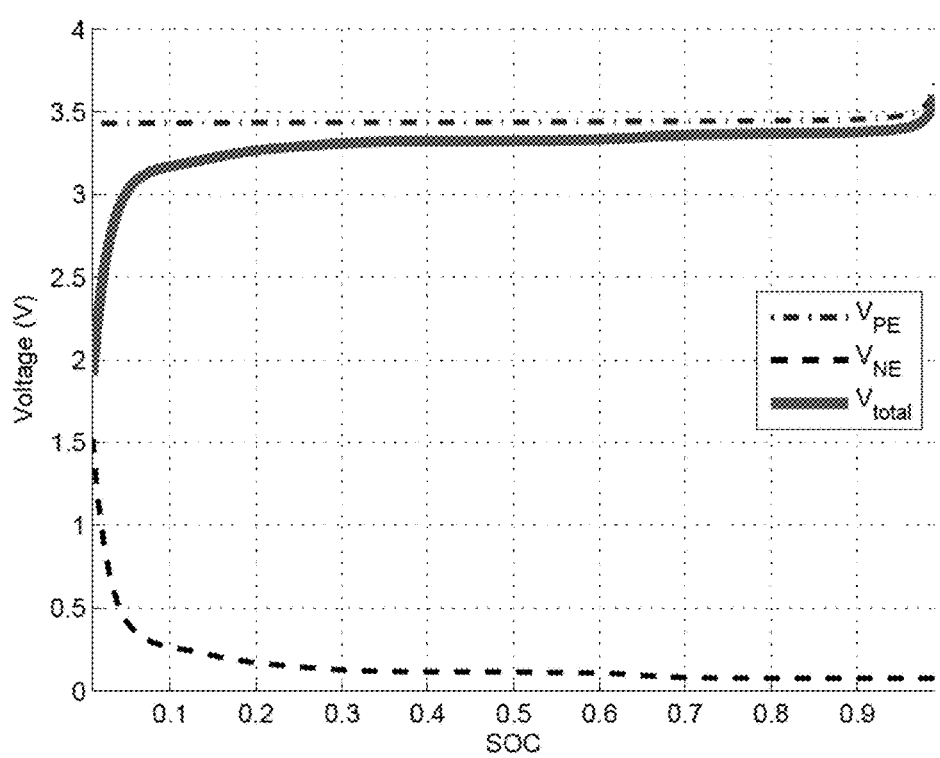
FIG. 5 is a graph depicting an open-circuit voltage of an example battery simulated using the mechanistic battery aging model.

From the simulation results shown in FIG. 8, one can see that the feasible region computed by the Monte Carlo simulations coincides with the region where y is a monotonic increasing. The results imply that the SVs for the battery V-Q curve model would stay invariant as long as the variation in the voltage data satisfies a quadratic and monotonic increasing relationship. As shown in FIGS. 5 and 6, the monotonic quadratic relationship is consistent with the simulation results and observations from the battery data.

Figure 9:
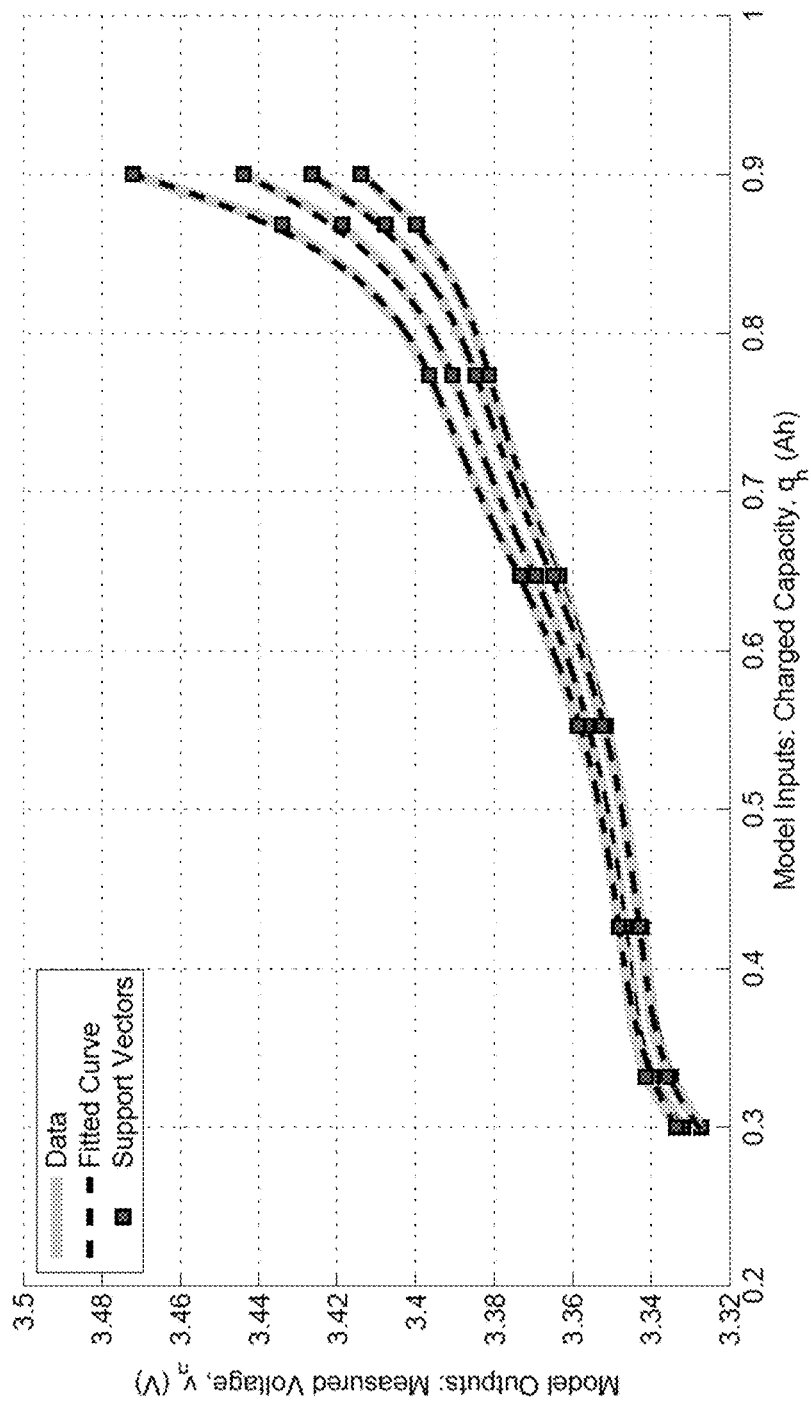
FIG. 9 is a graph depicting LP-SVR results for one cell at different ages.

According to the analysis performed above, the SVs should not change even when battery ages or varies for the applications. FIG. 9 show the LP-SVR results for the data of one cell at different ages. The invariance of the SVs can be clearly observed from the plot. Therefore, the structure obtained by the initial LP-SVR results can be used as a parametric model for the identification of battery V-Q curves. The model is parameterized as follows, $$v = \sum_{i=1}^{N_{sv}} \beta_i K(sv_i, q) + \mu \qquad (26)$$

For on-board implementation, the estimation problem of the model parameters $\beta$ and $\mu$ can be formulated as the following, $$v_j = \theta^T \phi_j \qquad (27)$$

where $$\theta = [\beta^T, \mu]^T$$

$$\phi_j = [K(sv_1, q_j), \ldots, K(sv_{N_{sv}}, q_j), 1]^T,$$

$$\beta = [\beta_1, \ldots, \beta_{N_{sv}}]^T \qquad (28)$$

and the parameters could be solved by the standard least squares method (LSM), $$\theta = (\Phi^T \Phi)^{-1} \Phi^T V, \qquad (29)$$

where $$V = [v_1, \ldots, v_N]^T$$

$$\Phi = [\phi_1, \ldots, \phi_N]^T. \qquad (30)$$

Given that the battery (V, Q) data are collected at fixed sample of Q points, $\Phi$ in (29) is a constant matrix for all time. Therefore, the parameter $\theta$ can be simply calculated as, $$\theta = h^T V, \qquad (31)$$

where $$h = \Phi(\Phi^T \Phi)^{-1} \qquad (32)$$

is a constant matrix.

The computational time of using the LP-SVR and the LSM for the V-Q curve identification are compared in Table I below. The four groups of data are sampled within the same range of charged capacity but with different sampling rate, so the results of different sizes of data could also be compared. One can see that the computational time of the LSM is much less than that of the LP-SVR, and insensitive to the dimension of sampled data.

TABLE 1

COMPUTATIONAL TIME COMPARISON

| # of Data Points | LP-SVR (sec.) | LSM (sec.) |
|---|---|---|
| 20 | 0.4733 | 0.000011 |
| 50 | 4.201 | 0.000011 |
| 100 | 30.01 | 0.000011 |
| 200 | 211.5 | 0.000016 |

† The assessment summarized in Table 1 was performed on a laptop computer with a 32-bit Intel Core2 Duo CPU @ 2.53 GHz and 4.0 GB RAM.

Thus, the parametric battery V-Q curve model provides a more robust and computationally efficient way to obtain the IC curves from raw data measurement, without sacrificing any estimation accuracy.

Figure 11:
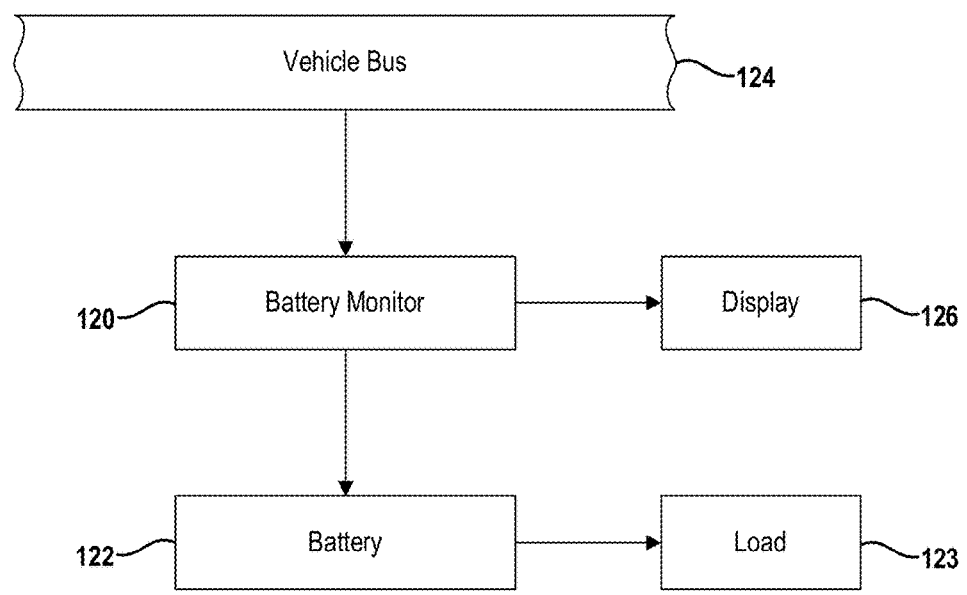
FIG. 11 is a diagram depicting an example battery monitoring device.

In one example embodiment, the methods for determining capacity of a battery as described above are implemented in a vehicle as shown in FIG. 11. In this example, a battery monitor 120 is interfaced directly with a battery 122 residing in the vehicle. During charging or discharging of the battery, the battery monitor 120 operates to measure the battery voltage through a range of states of charge. Once a sufficient number of voltage measures have been acquired, the battery monitor 120 determines the capacity of the battery in the manner set forth above. The computed battery capacity can in turn be communicated over a vehicle communication bus 124 and/or displayed to the vehicle operator on a display 126 in the vehicle. It is envisioned that the functionality for the battery monitor 120 may be implemented by an application specific integrated circuit (ASIC), an electronic circuit, a combination logic circuit, software or firmware executed by a computer processor and/or other suitable components that provide the described functionality. The battery monitor 120 may also be interfaced with a data store, such as a non-transitory computer memory, which stores the model for the battery.

In another example embodiment, the methods for determining capacity of a battery as described above are implemented in a portable monitoring device. In this example, the portable monitoring device can be transported amongst different batteries. To take voltage measures, the portable monitoring device is configured with cables, for example with a pair of alligator clips, for interfacing with terminals of a battery. The portable monitoring device can further include a display integrated therein for displaying an indicator for the battery capacity.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for monitoring state of health of a battery, comprising:
defining a model for a battery, where the model relates terminal voltage of the battery to charged capacity of the battery and defined in accordance with support vector regression;
measuring voltage of the battery through a range of states of charge, where the range excludes the battery being fully charged and fully discharged;
determining parameters of the model by fitting the voltage measures to the model;
determining an incremental capacity curve for the battery by taking derivative of the model; and
quantifying a peak of the incremental capacity curve, thereby determining a state of health for the battery.

2. The method of claim 1 wherein the model is defined as a radial basis function.

3. The method of claim 1 further comprises measuring the voltage of the battery during one of charging or discharging of the battery.

4. The method of claim 1 further comprises measuring the voltage of the battery while the state of charge of the battery varies between sixty percent and eighty percent.

5. The method of claim 1 further comprises measuring the voltage of the battery while the state of charge of the battery varies between thirty percent and eighty percent.

6. The method of claim 1 further comprises determining parameters of the model using a linear programming method.

7. The method of claim 1 further comprises determining parameters of the model using a least square method.

8. The method of claim 1 further comprises quantifying the state of health of the battery by determining a magnitude of the peak of the incremental capacity curve, and comparing the magnitude of the peak to a magnitude of the peak of the incremental capacity curve when the battery is known to be at a nominal value.

9. The method of claim 1 further comprises displaying an indicator of the state of health of the battery on a display device.

10. A method for determining capacity of a battery, comprising:
defining a model for a battery, where the model relates terminal voltage of the battery to charged capacity of the battery and is defined in accordance with support vector regression;
receiving a plurality of voltage measures of the battery, where the voltage measures were taken through a range of states of charge and the range excludes the battery being fully charged and fully discharged;
determining parameters of the model by fitting the plurality of voltage measures to the model;
determining an incremental capacity curve for the battery by taking derivative of the model; and
quantifying a peak of the incremental capacity curve to thereby determine a capacity of the battery, where the steps of determining the parameters, determining the incremental capacity curve and quantifying the peak are implemented by computer executable instructions executed by a computer processor.

11. The method of claim 10 wherein the plurality of voltage measures were taken while the state of charge of the battery varied between sixty percent and eighty percent.

12. The method of claim 10 wherein the plurality of voltage measures were taken while the state of charge of the battery varied between thirty percent and eighty percent.

13. The method of claim 10 further comprises determining parameters of the model using one of a linear programming method or a least square method.

14. The method of claim 10 further comprises quantifying a peak of the incremental capacity curve by determining a magnitude of the peak of the incremental capacity curve and expressing the determined magnitude of the peak in relation to a magnitude of the peak of the incremental capacity curve when the battery is known to be at its maximum capacity.

15. A battery monitoring device, comprising:
a data store for storing a model for a battery, where the model relates terminal voltage of the battery to charged capacity of the battery and is defined in accordance with support vector regression;
a battery monitor interfaced with a battery to measure voltage of the battery through a range of states of charge, where the range excludes the battery being fully charged and fully discharged,
the battery monitor determines parameters of the model by fitting the voltage measures to the model, determines an incremental capacity curve for the battery by taking derivative of the model, and quantifies a peak of the incremental capacity curve to thereby determine a capacity of the battery, wherein the battery monitor is implemented by computer executable instructions executed by a computer processor.

16. The battery monitor device of claim 15 resides in a portable housing having a display integrated therein, wherein the battery monitor operates to display an indicator for the battery capacity on the display.

17. The battery monitor device of claim 15 resides in a vehicle, wherein the battery monitor is interfaced with a communication bus in the vehicle.

18. The battery monitor device of claim 15 wherein the battery monitor measure voltage of the battery while the state of charge of the battery varies between thirty percent and eighty percent.

19. The battery monitor device of claim 15 wherein the battery is comprised of a plurality of battery cells.

* * * * *